US008378455B2

(12) United States Patent
Feichtinger et al.

(10) Patent No.: US 8,378,455 B2
(45) Date of Patent: Feb. 19, 2013

(54) ELECTRONIC COMPONENT ARRANGEMENT COMPRISING A VARISTOR AND A SEMICONDUCTOR COMPONENT

(75) Inventors: Thomas Feichtinger, Graz (AT); Guenter Engel, Leibnitz (AT); Axel Pecina, St. Martin (AT)

(73) Assignee: Epcos AG, Munich (DE)

( * ) Notice: Subject to any disclaimer, the term of this patent is extended or adjusted under 35 U.S.C. 154(b) by 0 days.

(21) Appl. No.: 12/994,141

(22) PCT Filed: May 14, 2009

(86) PCT No.: PCT/EP2009/055861
§ 371 (c)(1),
(2), (4) Date: Feb. 14, 2011

(87) PCT Pub. No.: WO2009/141266
PCT Pub. Date: Nov. 26, 2009

(65) Prior Publication Data
US 2011/0221037 A1 Sep. 15, 2011

(30) Foreign Application Priority Data
May 21, 2008 (DE) .......................... 10 2008 024 481

(51) Int. Cl.
*H01L 29/00* (2006.01)
(52) U.S. Cl. ................. 257/537; 257/E29.325; 257/146
(58) Field of Classification Search ................... 257/79, 257/146, 537, E29.325
See application file for complete search history.

(56) References Cited

U.S. PATENT DOCUMENTS

| 4,211,994 | A | 7/1980 | Oda |
| 7,696,856 | B2 | 4/2010 | Saito et al. |
| 7,705,709 | B2 | 4/2010 | Saito et al. |
| 2005/0184387 | A1* | 8/2005 | Collins et al. ................. 257/712 |
| 2006/0215342 | A1 | 9/2006 | Montoya et al. |
| 2007/0297108 | A1 | 12/2007 | Collins, III et al. |
| 2008/0083929 | A1* | 4/2008 | Fan et al. ........................ 257/79 |

FOREIGN PATENT DOCUMENTS

| DE | 2853134 | 7/1983 |
| DE | 102007013016 | 10/2007 |
| DE | 102007014300 | 10/2007 |
| EP | 1114807 | 7/2005 |
| EP | 1 580 809 | 9/2005 |
| EP | 1 858 033 | 11/2007 |
| JP | 11 228261 | 8/1999 |

* cited by examiner

*Primary Examiner* — Marcos D. Pizarro
*Assistant Examiner* — Eva Yan Montalvo
(74) *Attorney, Agent, or Firm* — Cozen O'Connor

(57) ABSTRACT

An electric component arrangement is described, comprising a semiconductor component (1) and a varistor body (2), which is contact-connected to the semiconductor component in order to protect the latter against electrostatic discharges. The semiconductor component and the varistor body are arranged on a common carrier (3) containing a highly thermally conductive ceramic.

16 Claims, 3 Drawing Sheets

ELECTRONIC COMPONENT ARRANGEMENT COMPRISING A VARISTOR AND A SEMICONDUCTOR COMPONENT

RELATED APPLICATIONS

This is a U.S. national stage of application No. PCT/EP2009/055861, filed on May 14, 2009.

This patent application claims the priority of German patent application no. 10 2008 024 481.3 filed May 21, 2008, the disclosure content of which is hereby incorporated by reference.

FIELD OF THE INVENTION

An electric component arrangement comprising heat-dissipating means for a semiconductor component according to one embodiment is described.

BACKGROUND OF THE INVENTION

DE 10 2007 013 016 A1 discloses a varistor component with heat conductors. According to one embodiment, a light-emitting diode is arranged on the varistor component.

SUMMARY OF THE INVENTION

One object to be achieved is to provide heat-dissipating means for an electric component in an arrangement.

An electric component arrangement is specified, comprising a semiconductor component and a varistor body, wherein the varistor body is contact-connected to the semiconductor component, preferably in parallel therewith, in order to protect said semiconductor component against electrostatic discharges. A carrier which contains a highly thermally conductive ceramic and on which both the semiconductor component and the varistor body are arranged is provided as heat-dissipating means. The carrier thus serves as a common heat-dissipating carrier for the semiconductor component and the varistor body. The component arrangement forms overall a self-support unit. The common carrier is also referred to hereinafter as heat sink or common heat sink.

By virtue of the separate arrangement of the semiconductor component and the varistor body on the common heat sink, the semiconductor component, by virtue of the connection of the semiconductor component to the varistor body, is afforded protection against overvoltages, in particular against electrostatic discharges, wherein the semiconductor component advantageously need not itself be developed or adapted for this purpose. The varistor body can be produced or designed separately for the purpose of the best possible protection against overvoltages of a semiconductor component electrically coupled to the varistor body, without taking account of the design of the semiconductor component. The function of protection against overvoltages of the varistor body is therefore permitted to be utilized fully without any restriction caused by the structure of the semiconductor component.

In accordance with one embodiment, the heat sink contains a highly thermally conductive ceramic. For example aluminum nitride, silicon carbide, hafnium oxide and manganese oxide have proved to be suitable ceramics. The highly thermally conductive ceramic can be formed as a matrix that takes up a highly thermally conductive filler, such as metal, for example. Thus, according to one embodiment, metal particles are contained as filler in the already highly thermally conductive ceramic matrix of the heat sink. This measure increases the total thermal conductivity of the heat sink even further.

According to one embodiment, the heat sink acting as a carrier is embodied as a plate or as a rigid support onto which the semiconductor component and the varistor body are mounted.

In accordance with one embodiment of the component arrangement, the semiconductor component and the varistor body are contact-connected to electrical conductor tracks applied on the common heat sink. In this case, heat can be dissipated not only directly from the semiconductor component and from the varistor body to the heat sink, but also from the electrical conductor tracks. The electrical conductor tracks can in each case have courses with multiple changes in direction or be realized as planar, geometrical patterns. They can be applied to the heat sink by means of screen printing.

According to one embodiment, the semiconductor component has, on its underside laying on the heat sink, external electrical contacts that are contact-connected to electrical conductor tracks on the heat sink. In this case, it is preferred for the external electrical contacts of the semiconductor component to be embodied as solder balls, in particular as flip-chip contact-connection. Such external electrical contacts considerably facilitate the mounting of the semiconductor component on the heat sink.

According to one advantageous embodiment, the heat sink has plated through-holes which, by way of example, are connected to conductor track structures applied, if appropriate, on the heat sink. Thus, an electrical contact-connection of the semiconductor component and/or the varistor body can be led through the heat sink to a printed circuit board, for example.

The heat sink can furthermore comprise a plurality of layers which are arranged one above another and between which run conductor tracks, for example, which could also be connected to plated through-holes of the heat sink. The layers can be dielectric layers, in particular highly thermally conductive ceramic layers.

In accordance with one preferred embodiment of the component arrangement, the varistor body contains a composite material composed at least of a varistor ceramic and a highly thermally conductive material, wherein the highly thermally conductive material differs from the varistor ceramic, which is principally chosen for the nonlinear resistance function of the varistor body. Suitable formulations for a matrix are, for example, the compounds zinc oxide-bismuth-antimony or zinc oxide-praseodymium.

In accordance with one embodiment, the varistor ceramic is formed as main component or as matrix of the composite material and the thermally conductive material is formed as filler in said matrix. One example of a highly thermally conductive filler is a metal.

The filler is preferably present as a distribution of highly thermally conductive particles in the varistor body. Suitable metals or alloys comprise, for example, tungsten, palladium, platinum, silver.

A metal preferably present as filler in the varistor ceramic has the advantage of imparting a higher thermal conductivity to the varistor body, such that heat can be dissipated to the heat sink by the varistor body itself. Heat passing by way of the electrical terminals between the semiconductor component and the varistor body can also be dissipated to the heat sink by means of the varistor body embodied in particularly thermally conductive fashion.

In one advantageous embodiment, the varistor body contains a highly thermally conductive ceramic that differs from the varistor ceramic or has a higher thermal conductivity than the varistor ceramic. Suitable ceramics have proved to be, for example, aluminum nitride, silicon carbide, hafnium oxide and manganese oxide, in particular also because they can be sintered well with a preferred varistor ceramic such as zinc oxide, for example, without undesirable crystalline interruptions forming in the varistor body. The additional, highly thermally conductive ceramic can be present, in a manner similar to that in the case of the metal, as filler in the varistor ceramic embodied as matrix.

The varistor body can be embodied as a multilayer varistor comprising a stack of varistor ceramic layers and internal electrode layers lying therebetween at least in regions. It is preferred for the multilayer varistor to be a sintered, monolithic multilayer component. In terms of principal proportion, zinc oxide is preferably chosen as varistor ceramic of the individual layers, wherein the internal electrodes can contain silver, palladium, platinum, copper, nickel or an alloy of these materials.

According to one embodiment, one or a plurality of layers of a varistor body embodied as a multilayer varistor can comprise zirconium oxide. In this case, it is preferred for at least the base layer of the multilayer varistor, said base layer lying on the ceramic heat sink, to contain zirconium oxide. It is thereby possible to reduce the influences of stray capacitances of the multilayer varistor on the ceramic heat sink and the conductor tracks present, if appropriate, on the ceramic heat sink. The top layer of the multilayer varistor could also be embodied as a layer containing zirconium oxide. That could be advantageous if a further component is arranged on the varistor body, said further component being intended to remain undisturbed by stray capacitances.

Instead of a multilayer varistor, the varistor body can be embodied as a bulk varistor. The latter has a single varistor block, at the outer side of which external contacts of opposite polarities are present. Internally, however, the varistor block is free of metallic layers.

In accordance with one embodiment, the varistor body has a plurality of electrical terminals, at least one first electrical terminal of which makes contact with the semiconductor component. Said electrical terminal is preferably embodied as a metallic layer on the varistor body. The metallic layer can be applied on at least one region of the top side of the varistor body, for example by means of screen printing. The electrical terminals are preferably bondable.

The plurality of electrical terminals can be connected to a contact wire and/or to a conductor track on the heat sink.

In accordance with one embodiment of the component arrangement, the plurality of electrical terminals of the varistor body comprise at least one second electrical terminal which is separate from the first electrical terminal and which makes contact with the varistor body toward the outside, which means that the varistor body is connected to a second electrical potential, isolated from the semiconductor component, by said second electrical terminal. A second electrical terminal can be a ground terminal, for example. In this case, the second electrical terminal can be contact-connected to a conductor track on a printed circuit board.

Both a first electrical terminal and a second electrical terminal can be embodied as metallic layers. Electrical terminals of the varistor body which are embodied as metallic layers can contain at least one of the following materials: gold, nickel, chromium, palladium, tin.

In accordance with one embodiment of the component arrangement, the second electrical terminal, which makes contact with the varistor body toward the outside, is arranged on the underside of the varistor body, that is to say on the area lying perpendicularly opposite the mounting area of the semiconductor component. The second electrical terminal can be embodied as a bonding pad, for example.

One embodiment provides for the second electrical terminal to be arranged in a manner spaced apart from the first electrical terminal on the top side of the varistor body. In this case, the two terminals could comprise contact wires that connect the varistor body to the semiconductor component and to ground.

One embodiment provides for the first electrical terminal of the varistor body, which makes contact with the semiconductor component, simultaneously to form a contact of the varistor body toward the outside, if appropriate using a contact wire used with the first electrical terminal.

In accordance with one embodiment, the varistor body has at least one internal electrode that can serve for tuning the capacitance of the varistor body. The internal electrode can be arranged between the layers of a layer stack. The internal electrode can be a ground electrode that dissipates overvoltages or surge currents through the varistor or from the varistor body. The internal electrode is connected to at least one electrical terminal of the varistor body—a mechanical contact-connection is not absolutely necessary in this case, however. The internal electrode could therefore be arranged in "floating" fashion within the varistor body. Alternatively, the internal electrode is connected to the at least one electrical terminal by means of at least one plated through-hole, which can also be designated as via.

In accordance with one embodiment, a plurality of internal electrodes are present in the varistor body and make contact with different electrical terminals of the varistor body. The internal electrodes can be embodied in floating fashion or in a manner contact-connected toward the outside. It is preferred for said electrodes to be isolated from one another by means of a varistor ceramic or by means of a dielectric and to have common overlap areas in the stacking direction, by means of which capacitances can be produced. In accordance with one embodiment, the internal electrodes run perpendicularly to the mounting area of the semiconductor component.

Preference is given to a component arrangement comprising a housing, in or at which the heat sink is arranged. It is preferred for the housing to have at least one electrically conductive part or region which is contact-connected to the varistor body and/or to the semiconductor component. The housing carries the varistor body, wherein the semiconductor component and the varistor body are connected in parallel with the electrically conductive part of the housing. The electrically conductive part of the housing can be embodied as a metallic layer, for example as a conductor track. The electrically conductive part of the housing preferably contains aluminum or copper.

In accordance with one embodiment, the housing has at least one thermally conductive region which is thermally coupled to the common carrier or the common heat sink of the varistor body and of the semiconductor component. As a result, heat taken up by the varistor body and/or by the common carrier can be dissipated through the housing. In this case, this thermally conductive region of the housing can comprise a highly thermally conductive material such as, for example, a highly thermally conductive ceramic or a metal.

In accordance with one expedient embodiment of the component arrangement, it additionally comprises a thermistor connected to the semiconductor component. In a manner dependent on its resistance/temperature characteristic curve, the thermistor contributes to the regulation of the control current of the semiconductor component, such that it can be operated with safeguarding care. In accordance with one embodiment, the thermistor is mounted on the varistor body, but need not be so mounted. Instead, it could be arranged on the common carrier or the common heat sink alongside the varistor body or separately from the carrier in a common housing. The thermistor can be connected to an evaluation unit, which uses measured values of the thermistor in order to regulate the current supplying the semiconductor component. The control current is regulated in such a way that the LED is not exposed to surge currents or is operated with as far as possible constant AC current.

The semiconductor component can be chosen from a large number of components. It can be an optoelectronic component, such as e.g. an LED, a capacitor or a multilayer capacitor, a thermistor or a multilayer thermistor having PTC or NTC properties, a diode or an amplifier. At all events the varistor body is able to protect the semiconductor component that is contact-connected to it against overvoltages with safeguarding care, and is even able, according to some embodiments described in this document, to dissipate heat from the semiconductor component.

An LED as semiconductor component is preferably composed of one or more of the following materials: gallium phosphide (GaP), gallium nitride (GaN), gallium arsenic phosphide (GaAsP), aluminum gallium indium phosphide (AlGaInP), aluminum gallium phosphide (AlGaP), aluminum gallium arsenide (AlGaAs), indium gallium nitride (InGaN), aluminum nitride (AlN), aluminum gallium indium nitride (AlGaInN), tin selenide (ZnSe).

The component arrangement comprising the common ceramic heat sink has the advantage of being industrially applicable as an individual product.

BRIEF DESCRIPTION OF THE DRAWINGS

The subjects described will be explained in greater detail with reference to the following exemplary embodiments and figures. In the figures.

DETAILED DESCRIPTION OF THE DRAWINGS

Figure 1:
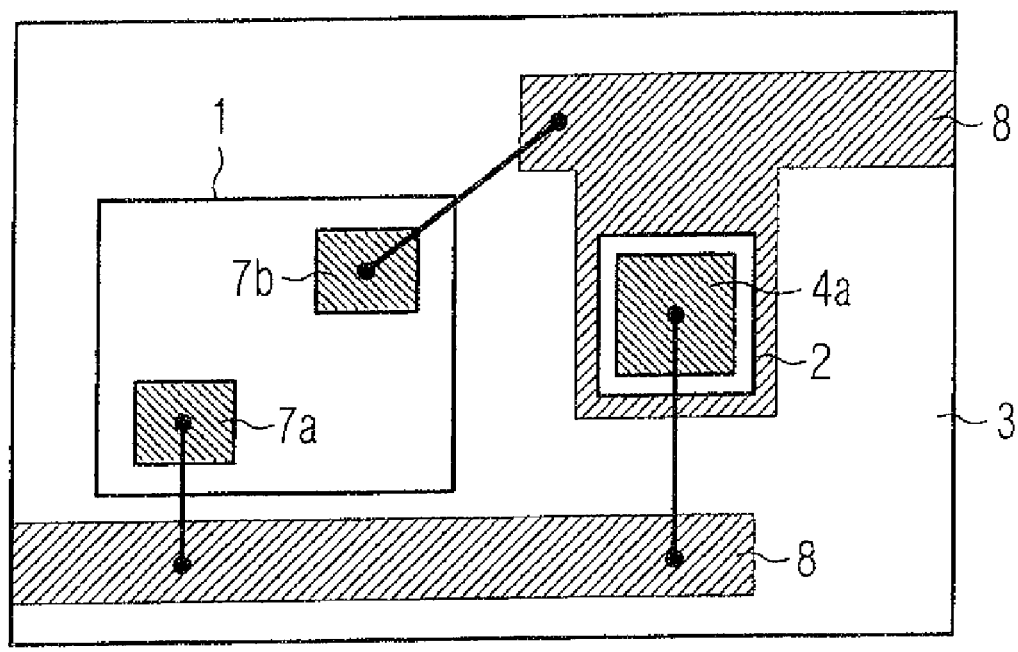
FIG. 1 shows a schematic plan view of a component arrangement in which a semiconductor component and a varistor body are mounted on a common heat sink and are connected to one another according to a first scheme.

FIG. 1 shows the plan view of an optoelectronic component arrangement in which a semiconductor component 1, here an LED, and also a varistor body 2 are arranged separately from one another on a common, thermally conductive ceramic carrier 3. In this example, the LED has an anode terminal 7a and a ground terminal 7b on the top side. The terminals 7a and 7b in each case comprise a bonding pad and also a contact wire connected to a conductor track 8 applied on the ceramic heat sink. Conductor tracks that are contact-connected to the terminals of the LED 1 are shaped in such a way that they are in each case connected to an electrical terminal of the varistor body 2.

The varistor body 2 has on the top side a first electrical terminal 4a, for example an anode terminal, which is embodied as a bonding pad. On the underside, the varistor body has a second electrical terminal 4b (not visible in the perspective of this figure), for example a ground terminal. The second electrical terminal 4b of the varistor body 2, said second electrical terminal being connected to the conductor track 8, can be embodied as a bonding pad or preferably as a flip-chip contact-connection.

Figure 2:
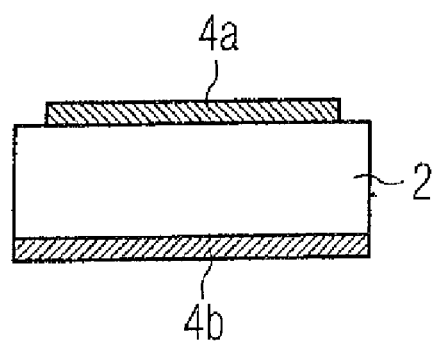
FIG. 2 shows a cross-sectional illustration of the varistor body shown by the plan view in FIG. 1.

FIG. 2 shows a cross-sectional view of the varistor body 2 shown in FIG. 1. The first electrical terminal 4a on the top side and also the second electrical terminal 4b on the underside are shown, in each case as a layer. The second electrical terminal 4b is preferably a ground terminal. A varistor body 2 or varistor chip has the following dimensions according to one preferred embodiment:

Length: 200 µm+/−10%
Width: 200 µm+/−10%
Thickness: 100 µm+/−10%

Figure 3:
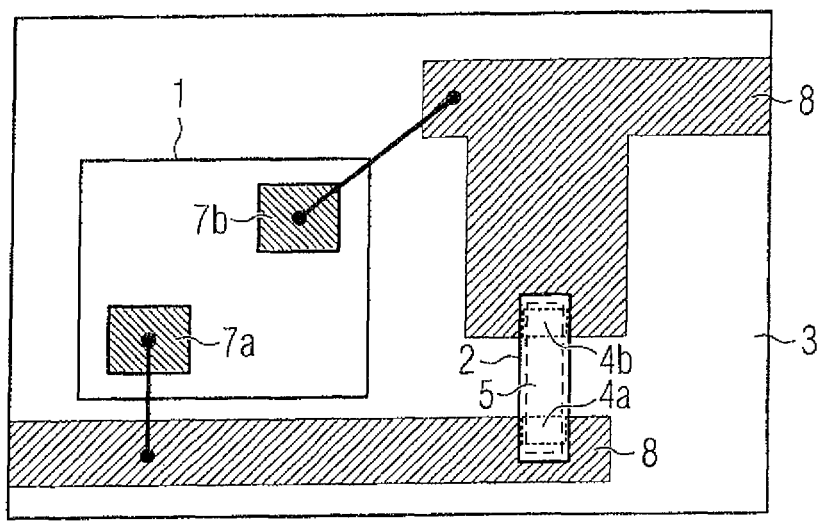
FIG. 3 shows a schematic plan view in accordance with FIG. 1, with the difference that the varistor body is contact-connected to different conductor tracks by means of a plurality of underside contacts and has at least one internal electrode.

FIG. 3 shows, in contrast to FIG. 1, a varistor body 2 having first 4a and second 4b electrical terminals that are fitted on the underside and are spaced apart from one another. Each of said electrical terminals 4a and 4b is contact-connected to a conductor track 8. However, the electrical terminals of the varistor body 2 make contact with different conductor tracks that are electrically insulated from one another. By means of a varistor resistor produced by means of a varistor ceramic contained in the varistor body, and an internal electrode 5, the electrical terminals 4a and 4b are connected to one another if the varistor body is exposed to overvoltages or becomes electrically conductive. In this case, although an internal electrode 5 (dashed frame) "floating" in the varistor body is shown, said internal electrode is not absolutely necessary. The arrangement of the internal electrodes 5 with or without plated through-holes that are contact-connected to said electrodes and electrical terminals is determined on the basis of the required voltage limit starting from which the varistor body becomes electrically conductive in order to dissipate the overvoltage from or to the semiconductor component.

Instead of electrical terminals 4a and 4b fitted on the underside, the varistor chip could have electrical terminals fitted laterally. Preferably, the electrical terminals at all events each form a closed layer, for example composed of materials containing nickel and/or tin (Sn). Layer thicknesses of external contacts of a varistor body or varistor chip that are embodied as layers can be between 0.9 and 3.1 µm.

Figure 4:
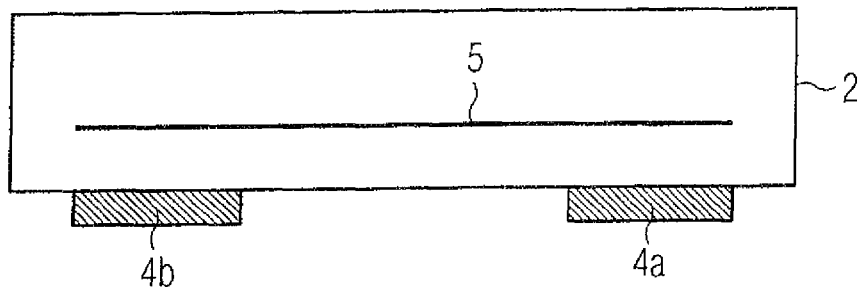
FIGS. 4 to 6 show different embodiments of a varistor body.

FIG. 4 shows a cross-sectional view of the varistor body shown by FIG. 3 in the plan view. The varistor body 2 comprises a layer stack of varistor-ceramic layers, between which an internal electrode 5 is arranged. Planar contact pads 4a and 4b are arranged on the underside of the varistor body, and they produce a planar connection to the respective conductor track 8 on the ceramic heat sink 3.

Figure 5:
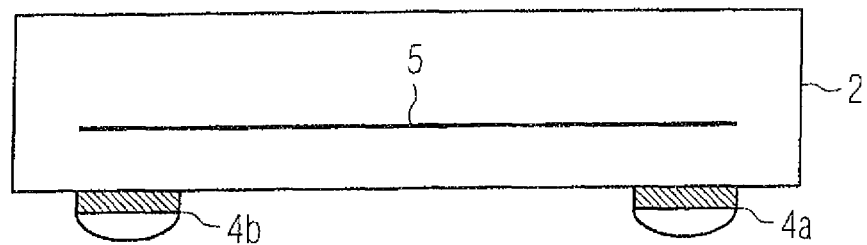

FIG. 5 shows a varistor body 2 in accordance with FIG. 4 with the difference that the contact pads 4a and 4b fitted on the underside are in each case composed of a planar contact pad projecting a little from the underside of the varistor body and a hemispherical contact pad, which are placed one above the other. In this case, the planar contact pads are applied directly to the varistor body and the hemispherical contact pads are applied to the underside of the respective planar contact pad.

Figure 6:
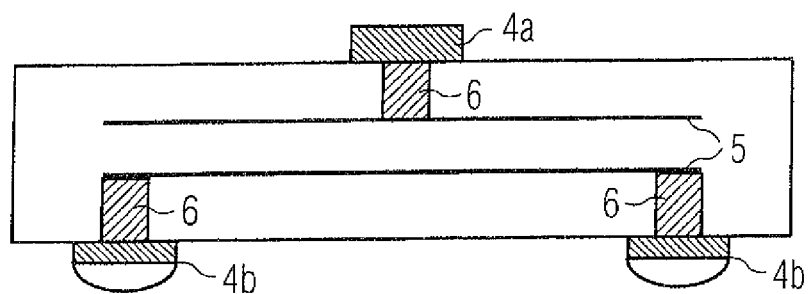

FIG. 6 shows a varistor body 2 having, on the top side, a first electrical terminal 4a, for example in the form of a planar contact pad projecting a little from the top side of the varistor body 2, which contact pad is contact-connected to a corresponding electrical terminal 7a of the same polarity on the semiconductor component, e.g. an anode terminal, for example by means of a contact wire either directly or indirectly by means of a conductor track 8. With regard to the construction of the electrical terminals 4b on the underside of the varistor body 2, the varistor body shown by this figure does not differ from that in the previous figure. However, these electrical terminals on the underside can be contact-connected differently toward the outside. By way of example, both electrical terminals 4b on the underside could be contact-connected to a ground terminal on the ceramic heat sink.

FIG. 6 furthermore shows plated through-holes 6 which run perpendicularly to the plane of the ceramic heat sink and internal electrodes 5 connected to electrical terminals 4a and 4b, respectively. In this case, a first plated through-hole 6 connects an electrical terminal 4a on the top side to a first internal electrode. Further plated through-holes 6 connect a second internal electrode to the plurality of electrical terminals 4b on the underside of the varistor body 2. The internal electrodes which in this manner are connected to plated through-holes in different ways are decoupled from one another by means of a varistor ceramic. Therefore, an internal electrode 5 of a first electrical pole is intended to produce an electrical connection to an internal electrode 5 of a second pole only when the varistor ceramic present between them becomes electrically conductive.

The plated through-holes 6 can be formed as holes filled with an electrically conductive material, for example metal.

All the embodiments of varistor bodies illustrated here can comprise a composite material composed of a varistor ceramic as matrix and a highly thermally conductive filler, for example small metal balls or metal particles. If a multilayer varistor body is involved, at least one layer or a plurality of layers can contain the highly thermally conductive filler.

Figure 7:
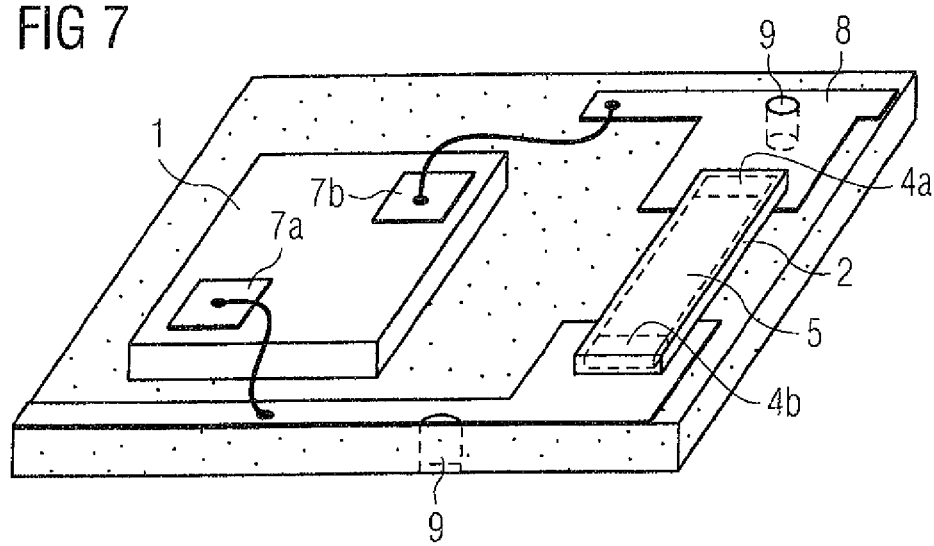
FIG. 7 shows a perspective view of a component arrangement.

FIG. 7 shows an optoelectronic component arrangement in a perspective view. Alongside the interconnection between the electrical components of the arrangement as shown schematically by FIG. 3, plated through-holes 9 are shown which can electrically connect the conductor tracks 8 printed on the ceramic heat sink to a further printed circuit board (not shown) or an external electrical circuit arrangement.

Figure 8:
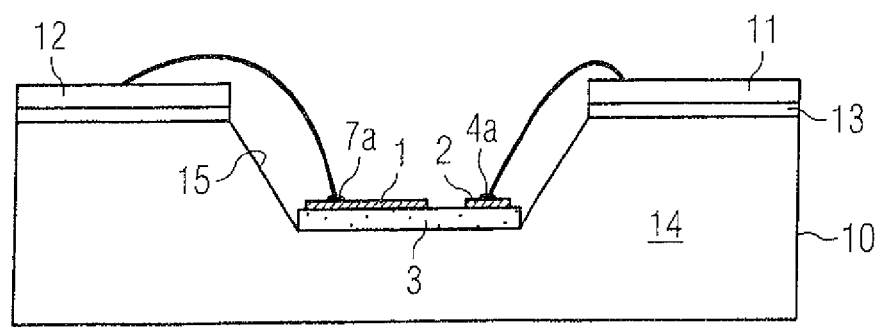
FIG. 8 shows an illustration of the component arrangement with or in a housing.

FIG. 8 shows an optoelectronic component arrangement of an embodiment described previously in this document, wherein the component arrangement additionally has a housing 10 having a depression or pit 15. The ceramic heat sink 3 lies on the bottom of this depression. Said ceramic heat sink can have one or a plurality of plated through-holes 9 which connect a ground terminal of the varistor body 2 to a ground terminal 14 of the housing. Alternatively, the ceramic heat sink 3 can be printed with a conductor track 8 in such a way that the latter connects the ground terminal of the varistor body 2 to the ground terminal 14 of the housing.

A semiconductor component 1 applied on the ceramic heat sink 3 is connected, on the top side, to a first electrically conductive part 12 of the housing by means of a contact wire. On the top side, the varistor body 2 is connected to a second electrically conductive part 13 of the housing by means of a contact wire. The first, second and also electrically conductive third part—serving as ground terminal 14—of the housing 10 are electrically decoupled from one another by means of an insulation 13.

While the semiconductor component is an LED, it is expedient if the depression 15 has a reflective coating on its surface exposed to the light from the LED. The entire coupling-out of light from the component arrangement can thereby be increased. The electrically conductive part of the housing 14 that serves as ground can consist, for example, of a metal such as e.g. copper or aluminum. A metal is preferred, in particular, which is electrically conductive with low resistance and has a high reflectivity for improved coupling-out of light.

Preferably, the varistor body 2 the common heat sink of the varistor body 2 and of the semiconductor component 1 is mechanically connected to a highly thermally conductive region of the housing, but at all events is thermally coupled to it in order that the housing 10 can dissipate heat taken up by the common heat sink, said heat originating from or being emitted by the varistor body 2 and/or by the semiconductor component 1, further toward the outside.

The scope of protection of the invention is not limited to the examples given hereinabove. The invention is embodied in each novel characteristic and each combination of characteristics, which includes every combination of any features which are stated in the claims, even if this feature or combination of features is not explicitly stated in the examples.

The invention claimed is:

1. An electric component arrangement, comprising:
a semiconductor component; and
a varistor body contact-connected to the semiconductor component to protect the semiconductor component against electrostatic discharges;
wherein the semiconductor component is arranged on a common carrier containing a thermally conductive ceramic, and the semiconductor component and the varistor body are arranged separately from one another on the common carrier;
wherein the varistor body contains a composite material composed at least of a varistor ceramic as matrix and a highly thermally conductive material as filler.

2. The component arrangement as claimed in claim 1, wherein the thermally conductive ceramic of the carrier comprises at least one of the materials aluminum nitride, gallium nitride, silicon carbide, hafnium oxide, manganese oxide.

3. The component arrangement as claimed in claim 1, wherein the carrier contains the thermally conductive ceramic as matrix and a metal as filler.

4. The component arrangement as claimed in claim 1, wherein the carrier comprises a plate.

5. The component arrangement as claimed in claim 1, wherein the carrier includes conductor tracks that are electrically decoupled from one another.

6. The component arrangement claim 5, wherein the semiconductor component and the varistor body are contact-connected to the conductor tracks.

7. The component arrangement as claimed in claim 5, wherein the varistor body includes external electrical contacts on its side facing the carrier, which make contact with at least one conductor track.

8. The component arrangement as claimed in claim 1, wherein the varistor body is connected in parallel with the semiconductor component.

9. The component arrangement as claimed in claim 1, wherein the varistor body includes at least one internal electrode.

10. The component arrangement as claimed in claim 1, wherein the varistor body includes at least one external electrical contact and at least one internal electrode, wherein the internal electrode is connected to the external contact by at least one plated through-hole.

11. The component arrangement as claimed in claim 1, wherein the carrier with the semiconductor component mounted on it and the varistor body is integrated in a housing, wherein the housing includes a thermally conductive region which is connected to the carrier and which is thermally coupled to the carrier.

12. The component arrangement as claimed in claim 1, wherein the varistor body comprises a monolithic multilayer varistor.

13. The component arrangement as claimed in claim 1, wherein the semiconductor component is chosen from the components: optoelectronic component, LED, capacitor, multilayer capacitor, thermistor, multilayer thermistor, diode, amplifier.

14. The component arrangement as claimed in claim 1, further comprising:
a thermistor which contributes, in a manner dependent on its resistance/temperature characteristic curve, to regulation of a control current of the semiconductor component.

15. An electric component arrangement, comprising:
a semiconductor component; and
a varistor body contact-connected to the semiconductor component to protect the semiconductor component against electrostatic discharges;
wherein the semiconductor component and the varistor body are arranged on a common carrier containing a thermally conductive ceramic as a matrix and a metal as a filler.

16. An electric component arrangement, comprising:
a semiconductor component; and
a varistor body contact-connected to the semiconductor component to protect the semiconductor component against electrostatic discharges, the varistor body containing a composite material composed at least of a varistor ceramic as a matrix and a highly thermally conductive material as a filler;
wherein the semiconductor component and the varistor body are arranged on a common carrier containing a thermally conductive ceramic.

* * * * *